United States Patent
Washington et al.

(10) Patent No.: US 11,393,683 B2
(45) Date of Patent: *Jul. 19, 2022

(54) METHODS FOR HIGH GROWTH RATE DEPOSITION FOR FORMING DIFFERENT CELLS ON A WAFER

(71) Applicant: UTICA LEASECO, LLC, Rochester Hills, MI (US)

(72) Inventors: Lori D. Washington, Santa Clara, CA (US); David P. Bour, Cupertino, CA (US); Gregg Higashi, San Jose, CA (US); Gang He, Cupertino, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 5 days.

This patent is subject to a terminal disclaimer.

(21) Appl. No.: 15/717,694

(22) Filed: Sep. 27, 2017

(65) Prior Publication Data

US 2018/0019117 A1 Jan. 18, 2018

Related U.S. Application Data

(63) Continuation-in-part of application No. 12/904,090, filed on Oct. 13, 2010, now Pat. No. 9,834,860.
(Continued)

(51) Int. Cl.
*C30B 25/16* (2006.01)
*H01L 21/02* (2006.01)
(Continued)

(52) U.S. Cl.
CPC .......... *H01L 21/0262* (2013.01); *C30B 25/02* (2013.01); *C30B 25/10* (2013.01);
(Continued)

(58) Field of Classification Search
CPC ....... C30B 25/00; C30B 25/02; C30B 25/025; C30B 25/16; C30B 25/165; C30B 29/00;
(Continued)

(56) References Cited

U.S. PATENT DOCUMENTS

| 3,993,533 A | 11/1976 | Milnes et al. |
| 4,172,756 A * | 10/1979 | Hollan .............. H01L 21/02395 117/102 |

(Continued)

FOREIGN PATENT DOCUMENTS

| CN | 101409233 A | 4/2009 |
| TW | I640648 B | 11/2018 |

OTHER PUBLICATIONS

International Search Report and Written Opinion corresponding to PCT Application No. PCT/US2018/049869, dated Jan. 2, 2019.
(Continued)

*Primary Examiner* — Kenneth A Bratland, Jr.
(74) *Attorney, Agent, or Firm* — ArentFox Schiff LLP (57) ABSTRACT

Aspects of the disclosure relate to processes for epitaxial growth of Group III/V materials at high rates, such as about 30 μm/hr or greater, for example, about 40 μm/hr, about 50 μm/hr, about 55 μm/hr, about 60 μm/hr, about 70 μm/hr, about 80 μm/hr, and about 90-120 μm/hr deposition rates. The Group III/V materials or films may be utilized in solar, semiconductor, or other electronic device applications. The Group III/V materials may be formed or grown on a sacrificial layer disposed on or over the support substrate during a vapor deposition process. Subsequently, the Group III/V materials may be removed from the support substrate during an epitaxial lift off (ELO) process. The Group III/V materials are thin films of epitaxially grown layers containing gallium arsenide, gallium aluminum arsenide, gallium indium arsenide, gallium indium arsenide nitride, gallium aluminum indium phosphide, phosphides thereof, nitrides
(Continued)

thereof, derivatives thereof, alloys thereof, or combinations thereof.

20 Claims, 5 Drawing Sheets

Related U.S. Application Data (60) Provisional application No. 61/251,677, filed on Oct. 14, 2009.

(51) Int. Cl.
    *C30B 29/42*     (2006.01)
    *C30B 25/10*     (2006.01)
    *C30B 29/40*     (2006.01)
    *C30B 25/18*     (2006.01)
    *C30B 25/02*     (2006.01)

(52) U.S. Cl.
    CPC ............ *C30B 25/183* (2013.01); *C30B 29/40* (2013.01); *C30B 29/42* (2013.01); *H01L 21/0254* (2013.01); *H01L 21/02395* (2013.01); *H01L 21/02463* (2013.01); *H01L 21/02543* (2013.01); *H01L 21/02546* (2013.01)

(58) Field of Classification Search
    CPC ......... C30B 29/10; C30B 29/40; C30B 29/42; C23C 16/00; C23C 16/30; C23C 16/301; C23C 16/455; C23C 16/45502; H01L 21/02395; H01L 21/02463; H01L 21/02546; H01L 21/0262
    USPC ... 117/84, 88–89, 92–93, 102–105, 953–955
    See application file for complete search history.

(56) References Cited

U.S. PATENT DOCUMENTS

| | | | |
|---|---|---|---|
| 4,368,098 A * | 1/1983 | Manasevit | C30B 25/02 |
| | | | 117/101 |
| 4,445,965 A | 5/1984 | Milnes | |
| 4,727,047 A | 2/1988 | Bozler et al. | |
| 4,742,012 A | 5/1988 | Matsumura et al. | |
| 4,846,931 A * | 7/1989 | Gmitter | B32B 43/00 |
| | | | 438/26 |
| 4,883,561 A | 11/1989 | Gmitter et al. | |
| 5,073,230 A | 12/1991 | Maracas et al. | |
| 5,076,860 A * | 12/1991 | Ohba | H01L 33/0062 |
| | | | 148/33.1 |
| 5,122,852 A | 6/1992 | Chan et al. | |
| 5,168,077 A * | 12/1992 | Ashizawa | C30B 25/02 |
| | | | 117/102 |
| 5,201,996 A | 4/1993 | Gmitter et al. | |
| 5,221,637 A | 6/1993 | De Boeck | |
| 5,232,869 A * | 8/1993 | Frigo | C23C 16/301 |
| | | | 117/104 |
| 5,256,562 A | 10/1993 | Vu et al. | |
| 5,258,325 A | 11/1993 | Spitzer et al. | |
| 5,276,345 A | 1/1994 | Siegel et al. | |
| 5,277,749 A | 1/1994 | Griffith et al. | |
| 5,286,335 A | 2/1994 | Drabik et al. | |
| 5,344,517 A | 9/1994 | Houlding | |
| 5,401,983 A | 3/1995 | Jokerst et al. | |
| 5,402,748 A * | 4/1995 | Takai | C30B 25/02 |
| | | | 117/84 |
| 5,458,694 A | 10/1995 | Nuyen | |
| 5,465,009 A | 11/1995 | Drabik et al. | |
| 5,476,810 A | 12/1995 | Curran | |
| 5,479,043 A | 12/1995 | Nuyen | |
| 5,528,719 A | 6/1996 | Yamada | |
| 5,546,375 A | 8/1996 | Shimada et al. | |
| 5,641,381 A | 6/1997 | Bailey et al. | |
| 5,827,751 A | 10/1998 | Nuyen | |
| 5,985,742 A | 11/1999 | Henley et al. | |
| 6,010,579 A | 1/2000 | Henley et al. | |
| 6,071,795 A | 6/2000 | Cheung et al. | |
| 6,155,909 A | 12/2000 | Henley et al. | |
| 6,211,539 B1 | 4/2001 | Johnston, Jr. et al. | |
| 6,214,733 B1 | 4/2001 | Sickmiller | |
| 6,221,740 B1 | 4/2001 | Bryan et al. | |
| 6,232,136 B1 | 5/2001 | Zavracky et al. | |
| 6,263,941 B1 | 7/2001 | Bryan et al. | |
| 6,284,631 B1 | 9/2001 | Henley et al. | |
| 6,287,891 B1 | 9/2001 | Sayyah | |
| 6,290,804 B1 | 9/2001 | Henley et al. | |
| 6,291,313 B1 | 9/2001 | Henley et al. | |
| 6,294,814 B1 | 9/2001 | Henley et al. | |
| 6,346,459 B1 | 2/2002 | Usenko et al. | |
| 6,352,909 B1 | 3/2002 | Usenko | |
| 6,372,981 B1 | 4/2002 | Ueda | |
| 6,387,829 B1 | 5/2002 | Usenko et al. | |
| 6,391,740 B1 | 5/2002 | Cheung et al. | |
| 6,414,783 B2 | 7/2002 | Zavracky et al. | |
| 6,458,672 B1 | 10/2002 | Henley et al. | |
| 6,486,041 B2 | 11/2002 | Henley et al. | |
| 6,500,732 B1 | 12/2002 | Henley et al. | |
| 6,504,524 B1 | 1/2003 | Gates et al. | |
| 6,511,899 B1 | 1/2003 | Henley et al. | |
| 6,513,564 B2 | 2/2003 | Bryan et al. | |
| 6,528,391 B1 | 3/2003 | Henley et al. | |
| 6,548,382 B1 | 4/2003 | Henley et al. | |
| 6,554,046 B1 | 4/2003 | Bryan et al. | |
| 6,559,075 B1 | 5/2003 | Kelly et al. | |
| 6,589,811 B2 | 7/2003 | Sayyah et al. | |
| 6,632,724 B2 | 10/2003 | Henley et al. | |
| 6,669,801 B2 | 12/2003 | Yoshimura et al. | |
| 6,677,249 B2 | 1/2004 | Laermer et al. | |
| 6,740,604 B2 | 5/2004 | Kelly et al. | |
| 6,790,747 B2 | 9/2004 | Henley et al. | |
| 6,809,044 B1 | 10/2004 | Aspar et al. | |
| 6,876,013 B2 | 4/2005 | Okano | |
| 6,890,838 B2 | 5/2005 | Henley et al. | |
| 6,943,050 B2 | 9/2005 | Kondo | |
| 6,974,521 B2 | 12/2005 | Schermer | |
| 7,045,878 B2 | 5/2006 | Faris | |
| 7,056,808 B2 | 6/2006 | Henley et al. | |
| 7,060,591 B2 | 6/2006 | Yamakazi et al. | |
| 7,153,761 B1 | 12/2006 | Nastasi et al. | |
| 7,160,790 B2 | 1/2007 | Henley et al. | |
| 7,163,826 B2 | 1/2007 | Faris | |
| 7,198,671 B2 | 4/2007 | Ueda | |
| 7,202,141 B2 | 4/2007 | Park et al. | |
| 7,229,498 B2 * | 6/2007 | Norman | C30B 25/02 |
| | | | 117/102 |
| 7,229,901 B2 | 6/2007 | Savage et al. | |
| 7,241,667 B2 | 7/2007 | Park et al. | |
| 7,341,925 B2 | 3/2008 | Kelly et al. | |
| 7,348,258 B2 | 3/2008 | Henley et al. | |
| 7,638,410 B2 | 12/2009 | Nastasi et al. | |
| 9,834,860 B2 * | 12/2017 | Washington | H01L 21/02395 |
| 2003/0121468 A1 * | 7/2003 | Boone | H01L 29/207 |
| | | | 117/78 |
| 2004/0113225 A1 * | 6/2004 | Ogihara | H01L 33/14 |
| | | | 257/500 |
| 2006/0252242 A1 | 11/2006 | Hanna et al. | |
| 2009/0149008 A1 | 6/2009 | Kryliouk et al. | |
| 2009/0321881 A1 | 12/2009 | Archer et al. | |
| 2009/0321885 A1 | 12/2009 | Archer et al. | |
| 2009/0321886 A1 | 12/2009 | Gmitter et al. | |
| 2009/0324379 A1 | 12/2009 | He et al. | |
| 2009/0325367 A1 | 12/2009 | He et al. | |
| 2010/0001316 A1 | 1/2010 | Gmitter et al. | |
| 2010/0001374 A1 | 1/2010 | Gmitter et al. | |
| 2010/0092668 A1 | 4/2010 | Hegedus | |
| 2011/0083601 A1 | 4/2011 | Washington et al. | |
| 2011/0186115 A1 | 8/2011 | Wanlass et al. | |
| 2012/0305059 A1 * | 12/2012 | Kayes | H01L 31/0735 |
| | | | 136/255 |

(56) References Cited

U.S. PATENT DOCUMENTS

2013/0112275 A1 5/2013 Hekmatshoar-Tabari et al.
2018/0019117 A1 1/2018 Washington et al.

OTHER PUBLICATIONS

Bauhuis, G.J., "Substrate Reuse for Epitaxial Lift-Off of III-V Solar Cells", Proceedings of the 22nd European Photovoltaic Solar Energy Conference: Milan Sep. 3-7, 2007, pp. 106-110.
Bauhuis, G.J., "Thin film GaAs solar cells with increased quantum efficiency due to light reflection", Solar Energy Materials & Solar Cells 83 (2004) 81-90, Nov. 3, 2003.
Konagai, Makoto, "High Efficieny GaAs THin Gilm Solar Cells by Peeled Film Technology", Journal of Crystal Growth 45 (1978) 277-280.
Kumar; P., "Sacrificial etching of $Al_xGa1-xAs$ for III-V MEMS surface micromachining", Appl. Phys. A 88, 711-714, May 24, 2007.
Schermer, J.J., "Expitaxial Lift-Off for large area thin film III/V devices", Phys. Stat. Sol. (1) 202, No. 4, 501-508 (2005).
Schremer, J.J., "Photon confinement in high-efficiency, thin-film III-IV solar cells obtained by epitaxial life-off", Thin Solid Films 511-512 (2006) 645-653, Jan. 19, 2006.
Schremer, J.J., "Thin-film GaAs Epitaxial Lift-Off Solar Cells for Space Application", Prog. Photovolt: Res, Appl. 2005; 13:587-596, Apr. 28, 2005.
Schremer, J.J., "Solar Cells Based on III-V Semiconductors", Joint Solar Panel, Sep. 29, 2004.
Sickmiller, M. "Packaging of Ultrathin Semiconductor Devices Through the ELO Packaging Process" Mat. Res. Soc. Symp. Proc. vol. 681E (2001).

Van Deelen, J., "On the development of high-efficiency thin-film GaAs and GainP2 cells", Journal of Crystal Growth 298 (2007) Nov. 28, 2006.
Van Niftrik, A.T.J., "HF Species and Dissolved Oxygen on the Epitaxial Lift-Off Process of GaAs Using AlAsP Release Layers", Journal of the Electrochemical Society, 155 (1) D35-D39 (2008), Nov. 6, 2007.
Van Niftrik, A.T.J., "A Diffusion and Reaction related Model of the Epitaxial Lift-Off Process", Journal of the Electrochemical Society, 154 (11) D629-D635 (2007), Sep. 19, 2007.
Van Niftrik, A.T.J., "The influence of $In_xGa1-xAs$ and $GaAs1-yPy$ Layers Surrounding the AlAs Release Layer in the Epitaxial Lift-Off Process", Crystal Growth & Design, 2007, vol. 7, No. 12, 2472-2480, Aug. 7, 2007.
Voncken, M.M.A.J., "Strain-accelerated HF etching of AlAs for epitaxial lift-off", J. Phys.: Condens, Matter 16 (2004) 3585-3596, May 14, 2004.
Voncken, M.M.A.J., "Influence of radius of curvature on the lateral etch rate of the weight induced epitaxial lift-off process", Material Science and Engineering B95 (2002) 242-248, May 21, 2002.
Voncken, M.M.A.J., "Multiple release layer study of the intrinsic lateral etch rate of the epitaxial lift-off process", Appl. Phys. A 79, 1801-1807, Mar. 28, 2003.
Yablonovitch, E., "Van De Waals bonding of GaAs epitaxial liftoff films onto arbitrary substrates" AppL Phys. Lett. 56 (24), Jun. 11, 1990.
Phosphine, Wikipedia, 2002 [retrieved from the internet on Feb. 16, 2021 at https://en.wikipedia.org/wiki/Phosphine], pp. 1-11.
Indium gallium phosphide, Wikipedia, May 10, 2005 [retrieved from the internet on Feb. 16, 2021 at https://en.wikipedia.org/wiki/Indium_gallium_phosphide], pp. 1-2.
International Search Report and Written Opinion issued in PCT/US2020/032676, dated Sep. 1, 2020, pp. 1-9.

* cited by examiner

METHODS FOR HIGH GROWTH RATE DEPOSITION FOR FORMING DIFFERENT CELLS ON A WAFER

CROSS-REFERENCE TO RELATED APPLICATION

This application is a Continuation-in-Part of non-provisional patent application Ser. No. 12/904,090, filed Oct. 13, 2010, which claims under 35 USC 119(e), the benefit of provisional patent application Ser. No. 61/251,677, filed Oct. 14, 2009. Each of these applications is incorporated herein by reference in its entirety.

BACKGROUND OF THE DISCLOSURE

Field of the Disclosure

Implementations of the disclosure generally relate to processes for depositing materials for solar, semiconductor, or other electronic device applications, and more particularly to epitaxial growth of Group III/V materials.

Description of the Related Art

Group III/V materials, such as gallium arsenide or gallium aluminum arsine, may be deposited or formed by epitaxial growth during a chemical vapor deposition (CVD) process. However, epitaxial growth of high quality Group III/V materials is often quite slow. A typical CVD process may epitaxially grow a Group III/V material at a deposition rate within a range from about 1 μm/hr to about 3 μm/hr. The quality of the epitaxial material is generally greatly reduced by slightly increasing the deposition rate. Usually, a Group III/V material grown at a deposition rate of about 5 μm/hr is of low quality and often has structural defects within the crystalline lattice and/or contains amorphous material.

Therefore, there is a need for a deposition process for depositing high quality, epitaxial Group III/V materials at high growth rates (e.g., at least greater than 5 μm/hr).

SUMMARY OF THE DISCLOSURE

Implementations of the disclosure generally relate processes for epitaxial growing Group III/V materials at high growth rates or deposition rates, such as about 30 μm/hr or greater, for example, about 40 μm/hr, about 50 μm/hr, about 55 μm/hr, about 60 μm/hr, about 70 μm/hr, about 80 μm/hr, or about 90-120 μm/hr. As used herein, the term "greater" in connection with growth or deposition rates may refer to higher deposition rates including those described within the context of this disclosure. As used herein, the term "about" may indicate an approximate value that can be within ±1%, ±2%, ±3%, ±5%, ±10%, ±15%, or ±20% of a nominal value. Moreover, as used herein, the range 90-120 μm/hr can indicate one or more different growth or deposition rates, including about 90 μm/hr, about 95 μm/hr, about 100 μm/hr, about 105 μm/hr, about 110 μm/hr, about 115 μm/hr, or about 120 μm/hr. The deposited Group III/V materials or films may be utilized in solar, semiconductor, or other electronic device applications. In some implementations, the Group III/V materials may be formed or grown on a sacrificial layer disposed on or over the support substrate during a vapor deposition process. Subsequently, the Group III/V materials may be removed from the support substrate during an epitaxial lift off (ELO) process. The Group III/V materials are thin films of epitaxially grown layers which contain gallium arsenide, gallium aluminum arsenide, gallium indium arsenide, gallium indium arsenide nitride, gallium aluminum indium phosphide, phosphides thereof, nitrides thereof, derivatives thereof, alloys thereof, or combinations thereof. The Group III/V materials can also be referred to as Group III/V semiconductors or Group III/V semiconductor materials.

In one implementation, a method for forming a Group III/V material containing gallium arsenide on a wafer is provided which includes heating the wafer to a deposition temperature of about 600° C. or greater within a processing system, exposing the wafer to a deposition gas containing a gallium precursor gas and arsine, and depositing a gallium arsenide layer on the wafer at a deposition rate of about 30 μm/hr or greater. As used herein, the term "30 μm/hr or greater" can refer to, for example, growth or deposition rates of about 40 μm/hr, about 50 μm/hr, about 55 μm/hr, about 60 μm/hr, about 70 μm/hr, about 80 μm/hr, or about 90-120 μm/hr. Moreover, as used herein, the term "greater" in connection with deposition temperatures may refer to higher temperatures including those described within the context of this disclosure. In another implementation, the wafer is heated to a deposition temperature of about 650° C. or greater within a processing system, and exposed to a deposition gas containing a gallium precursor gas, an aluminum precursor gas, and arsine. A Group III/V material containing a gallium aluminum arsenide layer is grown at a deposition rate of about 30 μm/hr or greater. For the 90-120 μm/hr deposition rates, the range of the deposition temperature can be between about 680° C. and about 850° C.

In another implementation, a method includes heating the wafer to a deposition temperature of about 600° C. or greater within a processing system, exposing the wafer to a deposition gas containing a gallium precursor gas, an indium precursor gas, and arsine, and depositing a Group III/V layer or material on the wafer at a deposition rate of about 30 μm/hr or greater (e.g., 90-120 μm/hr deposition rates). The Group III/V layer or material contains gallium, arsenic, and indium. In one example, the deposition temperature is within a range from about 650° C. to about 800° C. In some examples, the gallium precursor gas contains trimethylgallium and the indium precursor gas contains trimethylindium. For the 90-120 μm/hr deposition rates, the range of the deposition temperature can be between about 680° C. and about 850° C.

In some implementations, the deposition rate or growth rate may be about 40 μm/hr or greater, such as about 50 μm/hr or greater, preferably, about 55 μm/hr or greater, and more preferably, about 60 μm/hr or greater (e.g., 90-120 μm/hr deposition rates). In other implementations, the deposition temperature may be about 600° C. or greater, or may be about 700° C. or greater, or may be about 800° C. or greater, or may be about 850° C. In some examples, the deposition temperature may be within a range from about 550° C. to about 900° C. In other examples, the deposition temperature may be within a range from about 600° C. to about 800° C. In other examples, the deposition temperature may be within a range from about 650° C. to about 750° C. In other examples, the deposition temperature may be within a range from about 650° C. to about 720° C. For the 90-120 μm/hr deposition rates, the range of the deposition temperature can be between about 680° C. and about 850° C.

In another implementation, a method includes heating the wafer to a deposition temperature of about 600° C. or greater within a processing system, exposing the wafer to a deposition gas containing a gallium precursor gas, an indium precursor gas, a nitrogen precursor gas, and arsine, depositing a Group III/V layer or material on the wafer at a deposition rate of about 30 μm/hr or greater (e.g., 90-120 μm/hr deposition rates), wherein the Group III/V layer or material contains gallium, arsenic, indium, and nitrogen. The nitrogen precursor gas may contain hydrazine, methylhydrazine, dimethylhydrazine, derivatives thereof, or combinations thereof. In one example, the nitrogen precursor gas contains dimethylhydrazine. In another example, the nitrogen precursor gas contains hydrazine. In some examples, the gallium precursor gas contains trimethylgallium and the indium precursor gas contains trimethylindium. For the 90-120 μm/hr deposition rates, the range of the deposition temperature can be between about 680° C. and about 850° C.

In another implementation, a method includes heating the wafer to a deposition temperature of about 600° C. or greater within a processing system, exposing the wafer to a deposition gas containing a gallium precursor gas, an indium precursor gas, an aluminum precursor, and a phosphorus precursor, depositing a Group III/V layer or material on the wafer at a deposition rate of about 30 μm/hr or greater (e.g., 90-120 μm/hr deposition rates), wherein the Group III/V layer or material contains gallium, indium, aluminum, and phosphorus. In one example, the gallium precursor contains trimethylgallium, the aluminum precursor contains trimethylaluminum, the indium precursor contains trimethylindium, and the phosphorus precursor contains phosphine. For the 90-120 μm/hr deposition rates, the range of the deposition temperature can be between about 680° C. and about 850° C.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

DETAILED DESCRIPTION

The following description is presented to enable one of ordinary skill in the art to make and use the disclosure and is provided in the context of a patent application and its requirements. Various modifications to the preferred implementations and the generic principles and features described herein will be readily apparent to those skilled in the art. Thus, the present disclosure is not intended to be limited to the implementations shown, but is to be accorded the widest scope consistent with the principles and features described herein.

Implementations of the disclosure generally relate processes for epitaxial growing Group III/V materials at high growth rates, such as about 30 μm/hr or greater, for example, about 40 μm/hr, about 50 μm/hr, about 55 μm/hr, about 60 μm/hr, about 70 μm/hr, about 80 μm/hr, or about 90-120 μm/hr. The deposited Group III/V materials or films may be utilized in solar, semiconductor, or other electronic device applications. These electronic device applications may include applications that involve optoelectronic devices, components, or modules. In some implementations, the Group III/V materials may be formed or grown on a sacrificial layer disposed on over the support substrate during a vapor deposition process. Subsequently, the Group III/V materials may be removed from the support substrate during an epitaxial lift off (ELO) process, for example. The Group III/V materials are thin films of epitaxially grown layers which contain gallium arsenide, gallium aluminum arsenide, gallium indium arsenide, gallium indium arsenide nitride, gallium aluminum indium phosphide, phosphides thereof, nitrides thereof, derivatives thereof, alloys thereof, or combinations thereof.

In one implementation, a method for forming a Group III/V material containing gallium arsenide on the wafer is provided which includes heating a wafer to a deposition temperature of about 550° C. or greater within a processing system, exposing the wafer to a deposition gas containing a gallium precursor gas and arsine, and depositing a gallium arsenide layer on the wafer at a deposition rate of about 30 μm/hr or greater.

In another implementation, a method for forming a Group III/V material containing gallium aluminum arsenide is provided which includes heating the wafer to a deposition temperature of about 650° C. or greater within a processing system, exposing the wafer to a deposition gas containing a gallium precursor gas, an aluminum precursor gas, and arsine, and depositing a gallium aluminum arsenide layer at a deposition rate of about 30 μm/hr or greater. In one example, the Group III/V material contains an n-type gallium aluminum arsenide layer having the chemical formula of $Al_{0.3}Ga_{0.7}As$.

In another implementation, a method for forming a Group III/V material on a wafer or substrate is provided which includes heating a wafer to a deposition temperature of about 600° C. or greater within a processing system, exposing the wafer to a deposition gas containing a gallium precursor gas, an indium precursor gas, and arsine, and depositing a Group III/V layer on the wafer at a deposition rate of about 30 μm/hr or greater. The Group III/V layer contains gallium, arsenic, and indium. In one example, the deposition temperature is within a range from about 650° C. to about 800° C. In some examples, the gallium precursor gas contains trimethylgallium and the indium precursor gas contains trimethylindium.

In another implementation, a method for forming a Group III/V material on a wafer or substrate is provided which includes heating a wafer to a deposition temperature of about 600° C. or greater within a processing system, exposing the wafer to a deposition gas containing a gallium precursor gas, an indium precursor gas, a nitrogen precursor gas, and arsine, depositing a Group III/V layer on the wafer at a deposition rate of about 30 μm/hr or greater, wherein the Group III/V layer contains gallium, arsenic, indium, and nitrogen. The nitrogen precursor gas may contain hydrazine, methylhydrazine, dimethylhydrazine, derivatives thereof, or combinations thereof. In one example, the nitrogen precursor gas contains dimethylhydrazine. In another example, the nitrogen precursor gas contains hydrazine. In some examples, the gallium precursor gas contains trimethylgallium and the indium precursor gas contains trimethylindium.

In another implementation, a method for forming a Group III/V material on a wafer or substrate is provided which includes heating a wafer to a deposition temperature of about 600° C. or greater within a processing system, exposing the wafer to a deposition gas containing a gallium precursor gas, an indium precursor gas, an aluminum precursor, and a phosphorus precursor, depositing a Group III/V layer on the wafer at a deposition rate of about 30 μm/hr or greater, wherein the Group III/V layer contains gallium, indium, aluminum, and phosphorus. In one example, the gallium precursor contains trimethylgallium, the aluminum precursor contains trimethylaluminum, the indium precursor contains trimethylindium, and the phosphorus precursor contains phosphine.

In some implementations, the deposition rate or growth rate may be about 40 μm/hr or greater, such as about 50 μm/hr or greater, preferably, about 55 μm/hr or greater, and more preferably, about 60 μm/hr or greater (e.g., about 70 μm/hr, about 80 μm/hr, or about 90-120 μm/hr). In other implementations, the deposition temperature may be about 600° C. or greater, or may be about 700° C. or greater, or may be about 800° C. or greater, or may be about 850° C. In some examples, the deposition temperature may be within a range from about 550° C. to about 900° C. In other examples, the deposition temperature may be within a range from about 600° C. to about 800° C. In other examples, the deposition temperature may be within a range from about 650° C. to about 750° C. In other examples, the temperature may be within a range from about 650° C. to about 720° C. In other examples, such as for deposition rates of about 90-120 μm/hr, the deposition temperature may be within a range from about 680° C. to about 850° C.

The gallium precursor gas may contain an alkyl gallium compound. In one example, the alkyl gallium compound may be trimethylgallium or triethylgallium. In some implementations, the deposition gas may further contain an aluminum precursor gas and the gallium arsenide layer further contains aluminum. The aluminum precursor gas may contain an alkyl aluminum compound, such as trimethylaluminum or triethylaluminum. In other implementations, the deposition gas contains the arsine and the gallium precursor gas at an arsine/gallium precursor ratio of about 3 or greater, or may be about 4 or greater, or may be about 5 or greater, or may be about 6 or greater, or may be about 7 or greater. In some examples, the arsine/gallium precursor ratio may be within a range from about 5 to about 10. In other implementations, the Group III/V materials may be formed or grown from a deposition gas containing a ratio of Group V precursor to Group III precursor of about 30:1, or 40:1, or 50:1, or 60:1, or greater. In some examples, the deposition gas has a phosphine/Group III precursor of about 50:1.

The processing system may have an internal pressure within a range from about 20 Torr to about 1,000 Torr. In some implementations, the internal pressure may be ambient or greater than ambient, such as within a range from about 760 Torr to about 1,000 Torr. In some examples, the internal pressure may be within a range from about 800 Torr to about 1,000 Torr. In other examples, the internal pressure is within a range from about 780 Torr to about 900 Torr, such as from about 800 Torr to about 850 Torr. In other implementations, the internal pressure may be ambient or less than ambient, such as within a range from about 20 Torr to about 760 Torr, preferably, from about 50 Torr to about 450 Torr, and more preferably, from about 100 Torr to about 250 Torr.

In some implementations, the deposition gas further contains a carrier gas. The carrier gas may contain hydrogen ($H_2$), nitrogen ($N_2$), a mixture of hydrogen and nitrogen, argon, helium, or combinations thereof. In many examples, the carrier gas contains hydrogen, nitrogen, or a mixture of hydrogen and nitrogen.

In general, the flow rates for the various gases used in the deposition process may depend on the chemical vapor deposition (e.g., metal-organic chemical vapor deposition or MOCVD) tool used for the process.

Figure 1:
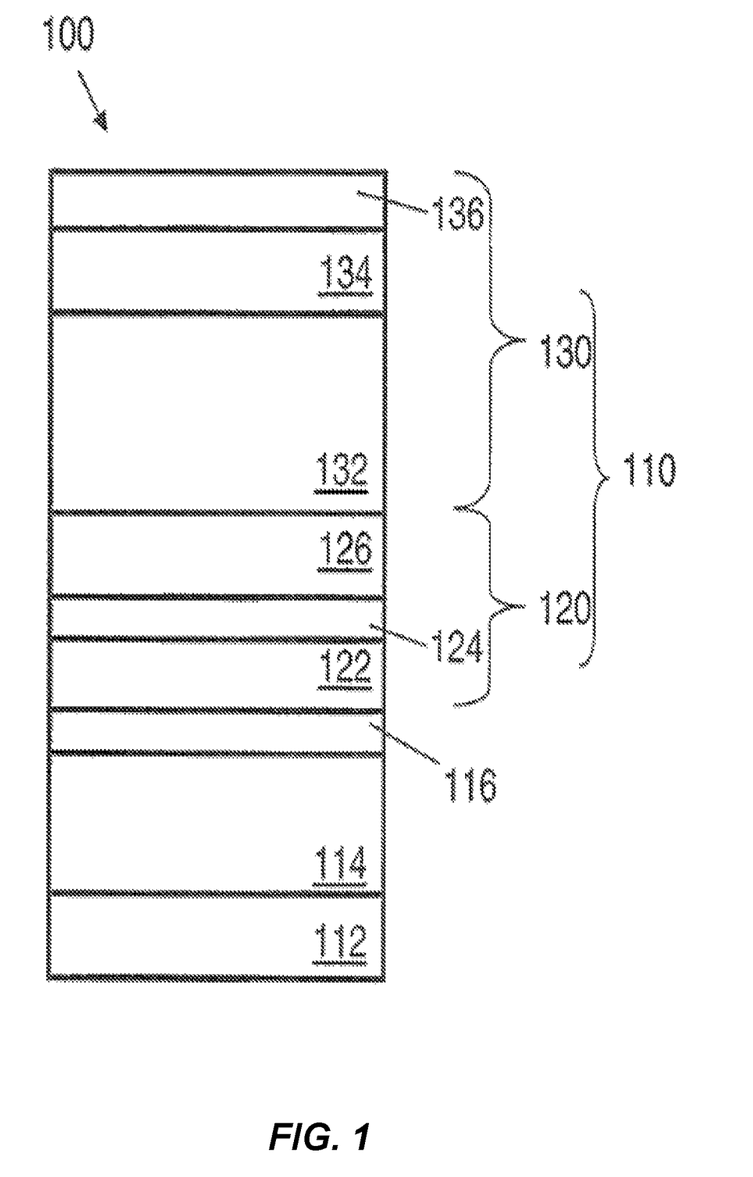
FIG. 1 illustrates an example of a gallium arsenide stack containing a variety of Group III/V layers, as described by some implementations herein.

FIG. 1 depicts gallium arsenide stack 100 containing multiple Group III/V materials or layers which may be formed by the high growth rate deposition processes according to implementations described herein. For example, one or more of the Group III/V materials or layers can be grown or deposited at any one of the following deposition rates: about 30 μm/hr, about 40 μm/hr, about 50 μm/hr, about 55 μm/hr, about 60 μm/hr, about 70 μm/hr, about 80 μm/hr, about 90 μm/hr, about 95 μm/hr, about 100 μm/hr, about 105 μm/hr, about 110 μm/hr, about 115 μm/hr, and about 120 μm/hr. Some of the multiple layers of Group III/V materials form gallium arsenide cell 110 within gallium arsenide stack 100. FIG. 1 depicts gallium arsenide stack 100 contains gallium arsenide cell 110 disposed on or over sacrificial layer 116 disposed on or over buffer layer 114 disposed on or over wafer 112.

Wafer 112 may be a support substrate containing Group III/V materials, and may be doped with various elements. Generally wafer 112 contains gallium arsenide, alloys thereof, derivatives thereof, and may be an n-doped substrate or a p-doped substrate. In many examples, wafer 112 is a gallium arsenide substrate or a gallium arsenide alloy substrate. The gallium arsenide substrate or wafer may have a thermal expansion coefficient of about $5.73 \times 10^{-6}$ °$C.^{-1}$.

Buffer layer 114 may be a gallium arsenide buffer layer which contains gallium arsenide, alloys thereof, dopants thereof, or derivatives thereof. Buffer layer 114 may have a thickness within a range from about 100 nm to about 1000 nm, such as about 200 nm or about 300 nm.

Sacrificial layer 116, also referred to as the ELO release layer, may contain aluminum arsenide, alloys thereof, derivatives thereof, or combinations thereof. Sacrificial layer 116 may have a thickness of about 20 nm or less. In some examples the thickness of sacrificial layer 116 may be within a range from about 1 nm to about 20 nm, such as from about 5 nm to about 20 nm, or in other examples, from about 1 nm to about 10 nm, such as from about 4 nm to about 6 nm.

Gallium arsenide cell 110 further contains n-type gallium arsenide stack 120 disposed on or over p-type gallium arsenide stack 130. The n-type gallium arsenide stack 120 usually contains multiples layers of various n-type doped materials. In one implementation, n-type gallium arsenide stack 120 contains emitter layer 126 disposed on or over passivation layer 124, disposed on or over contact layer 122. In some implementations, the n-type gallium arsenide stack 120 may have a thickness within a range from about 200 nm to about 1,300 nm.

Contact layer 122 may be a gallium arsenide contact layer which contains gallium arsenide, alloys thereof, dopants thereof, or derivatives thereof. In some examples, contact layer 122 contains an n-type gallium arsenide material. Contact layer 122 may have a thickness within a range from about 5 nm to about 100 nm, such as about 10 nm or about 50 nm.

Passivation layer 124, also referred to as the front window, generally contains aluminum gallium arsenide, alloys thereof, derivatives thereof, or combinations thereof. In many examples, passivation layer 124 contains an n-type aluminum gallium arsenide material. In one example, passivation layer 124 contains an n-type aluminum gallium arsenide material having the chemical formula of $Al_{0.3}Ga_{0.7}As$. Passivation layer 124 may have a thickness within a range from about 5 nm to about 100 nm, such as about 10 nm or about 50 nm.

Emitter layer 126 may contain gallium arsenide, alloys thereof, derivatives thereof, or combinations thereof. In many examples, emitter layer 126 contains an n-type gallium arsenide material. Emitter layer 126 may have a thickness within a range from about 100 nm to about 3000 nm. In some examples the thickness of emitter layer 126 may be within a range from about 100 nm to about 600 nm, such as from about 200 nm to about 400 nm, or in other examples, from about 600 nm to about 1,200 nm, such as from about 800 nm to about 1,000 nm.

The p-type gallium arsenide layer or stack 130 usually contains multiples layers of various p-type doped materials. In one implementation, p-type gallium arsenide stack 130 contains contact layer 136 disposed on or over passivation layer 134, disposed on or over absorber layer 132. In an alternative implementation, absorber layer 132 is absent from p-type gallium arsenide stack 130. Therefore, p-type gallium arsenide stack 130 contains contact layer 136 disposed on or over passivation layer 134, and passivation layer 134 may be disposed on or over n-type gallium arsenide stack 120, emitter layer 126, or another layer. In some implementations, the p-type gallium arsenide stack 130 may have a thickness within a range from about 100 nm to about 3,000 nm.

Absorber layer 132 may contain gallium arsenide, alloys thereof, derivatives thereof, or combinations thereof. In many examples, absorber layer 132 contains a p-type gallium arsenide material. In one implementation, absorber layer 132 may have a thickness within a range from about 1 nm to about 3,000 nm. In some examples the thickness of absorber layer 132 may be within a range from about 1 nm to about 1,000 nm, such as from about 10 nm to about 100 nm, or in other examples, from about 1,000 nm to about 3,000 nm, such as from about 1,100 nm to about 2,000 nm. In some examples the thickness of absorber layer 132 may be within a range from about 100 nm to about 600 nm, such as from about 200 nm to about 400 nm, or in other examples, from about 600 nm to about 1,200 nm, such as from about 800 nm to about 1,000 nm.

Passivation layer 134, also referred to as the rear window, generally contains aluminum gallium arsenide, alloys thereof, derivatives thereof, or combinations thereof. In many examples, passivation layer 134 contains a p-type aluminum gallium arsenide material. In one example, passivation layer 134 contains a p-type aluminum gallium arsenide material having the chemical formula of $Al_{0.3}Ga_{0.7}As$. Passivation layer 134 may have a thickness within a range from about 25 nm to about 100 nm, such as about 50 nm or about 300 nm.

Contact layer 136 may be a p-type gallium arsenide contact layer which contains gallium arsenide, alloys thereof, dopants thereof, or derivatives thereof. In some examples, contact layer 136 contains a p-type gallium arsenide material. Contact layer 136 may have a thickness within a range from about 5 nm to about 100 nm, such as about 10 nm or about 50 nm.

Aspects of the deposition processes for depositing or forming Group III/V materials, as described herein, may be conducted in a processing system such as, for example, a single wafer deposition chamber, a multi-wafer deposition chamber, a stationary deposition chamber, or a continuous feed deposition chamber. One continuous feed deposition chamber that may be utilized for depositing or forming Group III/V materials is described in the commonly assigned U.S. Ser. No. 12/475,131 (titled "Methods and Apparatus for a Chemical Vapor Deposition Reactor") filed on May 29, 2009, and U.S. Ser. No. 12/475,169 (titled "Methods and Apparatus for a Chemical Vapor Deposition Reactor" filed on May 29, 2009 and issued as U.S. Pat. No. 8,602,707, each of which is herein incorporated by reference.

EXAMPLES

In one implementation, a deposition gas may be formed by combining or mixing two, three, or more chemical precursors within a gas manifold prior to entering or passing through the showerhead. In another implementation, the deposition gas may be formed by combining or mixing two, three, or more chemical precursors within a reaction zone after passing through the showerhead. The deposition gas may also contain one, two or more carrier gases, which may also be combined or mixed with the precursor gases prior to or subsequent to passing through the showerhead. The carrier gas may be hydrogen, nitrogen, argon, or combinations thereof. The internal pressure of the deposition chamber may be within a range from about 250 Torr to about 450 Torr.

Example 1—GaAs

In one example, the deposition gas may be formed by combining a gallium precursor (e.g., TMG) and an arsenic precursor (e.g., arsine). The substrate may be heated to a deposition temperature and exposed to the deposition gas. The deposition temperature can have a wide range. In one example, the deposition temperature may be within a range from about 600° C. to about 800° C., such as from about 650° C. to about 750° C. or from about 650° C. to about 720° C. In one example, the deposition gas may contain about 100 cc of arsine in about 2,000 cc of hydrogen gas ($H_2$) and about 200 cc of a mixture of TMG/$H_2$ (about 10% TMG in $H_2$. The Group III/V material contains gallium and arsenic and may be deposited at a rate of about 30 μm/hr or greater, such as about 40 μm/hr or greater, preferably, about 50 μm/hr or greater, preferably, about 55 μm/hr or greater, and more preferably, about 60 μm/hr or greater. In an example, deposition rates greater than about 60 μm/hr can include deposition rates of about 70 μm/hr, about 80 μm/hr, or about 90-120 μm/hr. For the deposition rates of about 90-120 μm/hr the deposition temperature can be in the range from about 680° C. to about 850° C.

Example 2—GaAlAs

In another example, the deposition gas may be formed by combining a gallium precursor (e.g., TMG), an aluminum precursor (e.g., TMA), and an arsenic precursor (e.g., arsine). The substrate may be heated to a deposition temperature and exposed to the deposition gas. The deposition temperature can have a wide range. In one example, the deposition temperature may be within a range from about 600° C. to about 800° C. In one example, the deposition gas may contain about 100 cc of arsine in about 2,000 cc of hydrogen gas; about 200 cc of a mixture of TMG/H$_2$ (about 10% TMG in H$_2$); and about 200 cc of TMA/H$_2$ (about 1% TMA in H$_2$). The Group III/V material contains gallium, aluminum, and arsenic and may be deposited at a rate of about 30 μm/hr or greater, such as about 40 μm/hr or greater, preferably, about 50 μm/hr or greater, preferably, about 55 μm/hr or greater, and more preferably, about 60 μm/hr or greater. In an example, deposition rates greater than about 60 μm/hr can include deposition rates of about 70 μm/hr, about 80 μm/hr, or about 90-120 μm/hr. For the deposition rates of about 90-120 μm/hr the deposition temperature can be in the range from about 680° C. to about 850° C.

Example 3—AlGaInP

In another example, the deposition gas may be formed by combining a gallium precursor (e.g., TMG), an aluminum precursor (e.g., TMA), an indium precursor (e.g., trimethylindium-TMI), and a phosphorus precursor (e.g., phosphine-PH$_3$). The substrate may be heated to a deposition temperature and exposed to the deposition gas. The deposition temperature can have a wide range. In one example, the deposition temperature may be within a range from about 600° C. to about 800° C. In one example, the deposition gas may contain about 200 cc of a mixture of TMG/H$_2$ (about 10% TMG in H$_2$); about 200 cc of TMA/H$_2$ (about 1% TMA in H$_2$); about 200 cc of TMI/H$_2$ (about 1% TMI in H$_2$); and about 100 cc of phosphine in about 2,000 cc of hydrogen gas. The Group III/V material contains gallium, aluminum, indium, and phosphorus and may be deposited at a rate of about 30 μm/hr or greater, such as about 40 μm/hr or greater, preferably, about 50 μm/hr or greater, preferably, about 55 μm/hr or greater, and more preferably, about 60 μm/hr or greater. In an example, deposition rates greater than about 60 μm/hr can include deposition rates of about 70 μm/hr, about 80 μm/hr, or about 90-120 μm/hr. For the deposition rates of about 90-120 μm/hr the deposition temperature can be in the range from about 680° C. to about 850° C.

Example 4—GaInAs

In another example, the deposition gas may be formed by combining a gallium precursor (e.g., TMG), an indium precursor (e.g., trimethylindium), and an arsenic precursor (e.g., arsine). The substrate may be heated to a deposition temperature and exposed to the deposition gas. The deposition temperature can have a wide range. In an example, the deposition temperature may be within a range from about 600° C. to about 800° C. In one example, the deposition gas may contain about 100 cc of arsine in about 2,000 cc hydrogen gas; about 200 cc of a mixture of TMG/H$_2$ (about 10% TMG in H$_2$); and about 200 cc of TMI/H$_2$ (about 1% TMI in H$_2$). The Group III/V material contains gallium, indium, and arsenic and may be deposited at a rate of about 30 μm/hr or greater, such as about 40 μm/hr or greater, preferably, about 50 μm/hr or greater, preferably, about 55 μm/hr or greater, and more preferably, about 60 μm/hr or greater. In an example, deposition rates greater than about 60 μm/hr can include deposition rates of about 70 μm/hr, about 80 μm/hr, or about 90-120 μm/hr. For the deposition rates of about 90-120 μm/hr the deposition temperature can be in the range from about 680° C. to about 850° C.

Example 5—GaInAsN

In another example, the deposition gas may be formed by combining a gallium precursor (e.g., TMG), an indium precursor (e.g., trimethylindium), an arsenic precursor (e.g., arsine), and a nitrogen precursor (e.g., dimethylhydrazine or hydrazine). The substrate may be heated to a deposition temperature and exposed to the deposition gas. The deposition temperature can have a wide range. In an example, the deposition temperature may be within a range from about 400° C. to about 500° C., such as about 450° C. In one example, the deposition gas may contain about 10 cc of arsine in about 2,000 cc of hydrogen gas; about 200 cc of a mixture of TMG/H$_2$ (about 10% TMG in H$_2$); about 200 cc of TMI/H$_2$ (about 1% TMI in H$_2$); and about 100 cc of dimethylhydrazine in about 1,000 cc of hydrogen gas. The Group III/V material contains gallium, indium, aluminum, arsenic, and nitrogen and may be deposited at a rate of about 30 μm/hr or greater, such as about 40 μm/hr or greater, preferably, about 50 μm/hr or greater, preferably, about 55 μm/hr or greater, and more preferably, about 60 μm/hr or greater. In an example, deposition rates greater than about 60 μm/hr can include deposition rates of about 70 μm/hr, about 80 μm/hr, or about 90-120 μm/hr. For the deposition rates of about 90-120 μm/hr the deposition temperature can be in the range from about 680° C. to about 850° C.

Example 6—GaInAsP

In another example, the deposition gas may be formed by combining a gallium precursor (e.g., TMG), an indium precursor (e.g., trimethylindium), an arsenic precursor (e.g., arsine), and a phosphorus precursor (e.g., phosphine-PH$_3$). The substrate may be heated to a deposition temperature and exposed to the deposition gas. The deposition temperature can have a wide range. In an example, the deposition temperature may be within a range from about 600° C. to about 800° C. In one example, the deposition gas may contain about 100 cc of arsine in about 2,000 cc of hydrogen gas; about 200 cc of a mixture of TMG/H$_2$ (about 10% TMG in H$_2$); about 200 cc of TMI/H$_2$ (about 1% TMI in H$_2$); and about 100 cc of phosphine in about 2,000 cc of hydrogen gas. The Group III/V material contains gallium, indium, arsenic, and phosphorus, and may be deposited at a rate of about 30 μm/hr or greater, such as about 40 μm/hr or greater, preferably, about 50 μm/hr or greater, preferably, about 55 μm/hr or greater, and more preferably, about 60 μm/hr or greater. In an example, deposition rates greater than about 60 μm/hr can include deposition rates of about 70 μm/hr, about 80 μm/hr, or about 90-120 μm/hr. For the deposition rates of about 90-120 μm/hr the deposition temperature can be in the range from about 680° C. to about 850° C.

In the examples described above, the term "cc" may refer to cubic centimeters and may correspond to a flow rate or flow unit, such as a standard cubic centimeters per minute (sccm).

Figure 2:
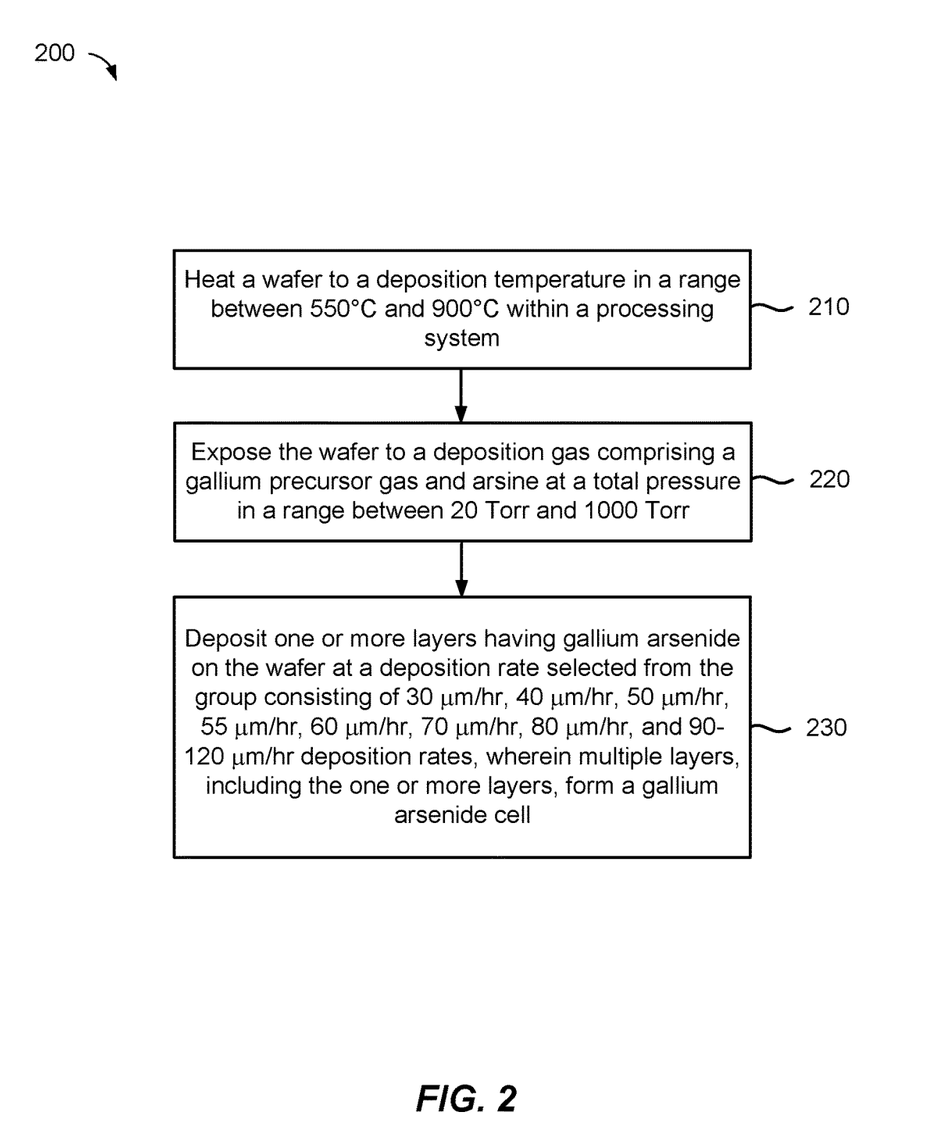
FIG. 2 illustrates an example of a method for forming a semiconductor material on a wafer, as described in some implementations herein.

FIG. 2 illustrates an example of a method 200 for forming a semiconductor material on a wafer, as described in some implementations herein.

At block 210, the method 200 includes heating a wafer to a deposition temperature in a range between 550° C. and 900° C. within a processing system.

At block 220, the method 200 includes exposing the wafer to a deposition gas comprising a gallium precursor gas and arsine at a total pressure in a range between 20 Torr and 1000 Torr.

At block 230, the method 200 includes depositing one or more layers having gallium arsenide on the wafer at a deposition rate selected from the group consisting of 30 μm/hr, 40 μm/hr, 50 μm/hr, 55 μm/hr, 60 μm/hr, 70 μm/hr, 80

μm/hr, and 90-120 μm/hr deposition rates, wherein multiple layers, including the one or more layers, form a gallium arsenide cell.

In an aspect of the method 200, for the 90-120 μm/hr deposition rates the range of the deposition temperature can be between 680° C. and 850° C.

In another aspect of the method 200, the deposition gas can further include an aluminum precursor gas and the gallium arsenide layer can further include aluminum. The aluminum precursor gas can include an alkyl aluminum compound. The alkyl aluminum compound can be trimethylaluminum or triethylaluminum.

In another aspect of the method 200, the deposition gas can further include a carrier gas comprising a mixture of hydrogen and argon.

In another aspect of the method 200, an n-type portion of the gallium arsenide cell is deposited over a sacrificial layer having a thickness between 1 nm and 20 nm, where the sacrificial layer is disposed over a buffer layer, and the buffer layer is disposed over the wafer.

In another aspect of the method 200, the multiple layers form an n-type gallium arsenide stack and a p-type gallium arsenide stack, where the n-type gallium arsenide stack has an emitter layer disposed on or over a first passivation layer, and where the first passivation layer is disposed on or over a first contact layer; and where the p-type gallium arsenide stack has a second contact layer disposed on or over a second passivation layer, and where the second passivation layer being disposed on or over an absorber layer.

In another aspect of the method 200, the range of the deposition temperature can be between 600° C. and 800° C.

In another aspect of the method 200, the range of the total pressure can be selected from the group consisting of between 20 Torr and 760 Torr, between 50 Torr and 450 Torr, and between 100 Torr and 250 Torr.

Figure 3:
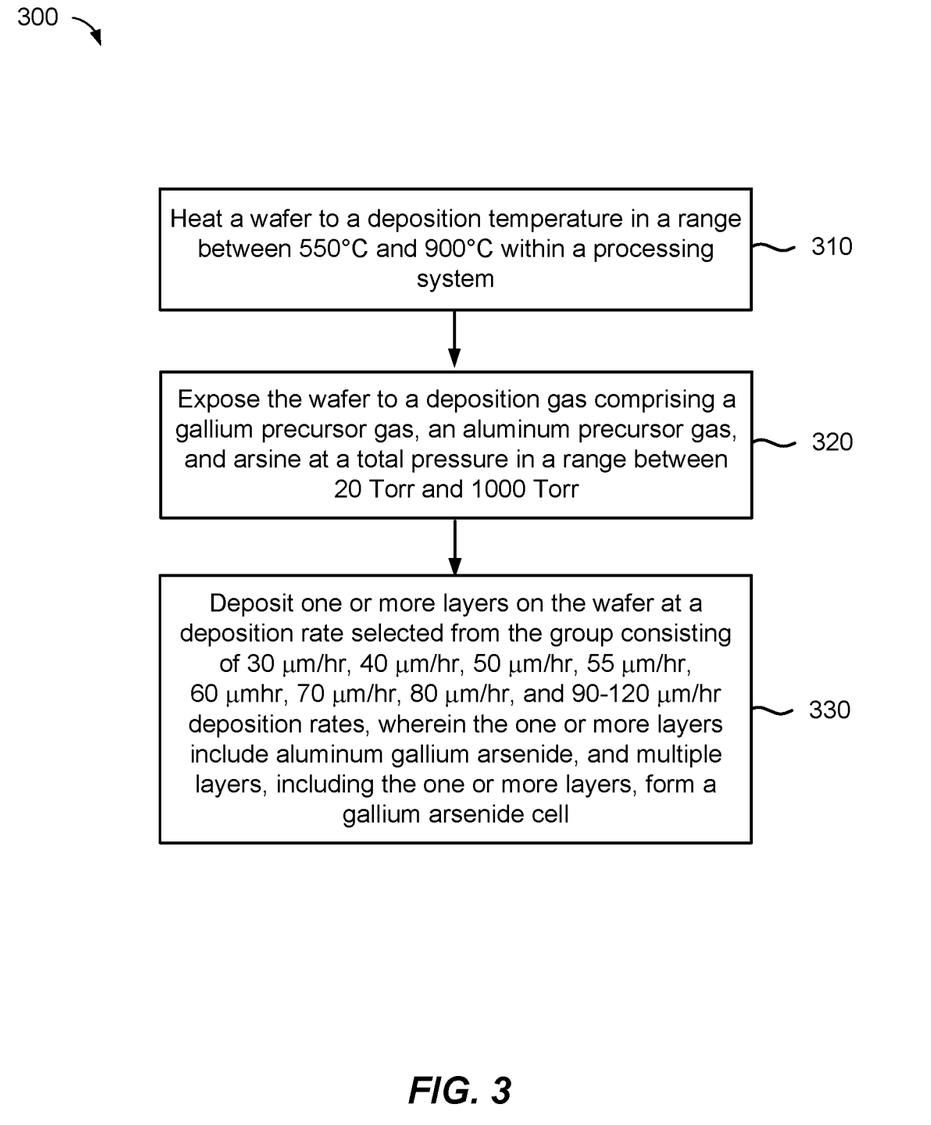
FIG. 3 illustrates an example of another method for forming a semiconductor material on a wafer, as described in some implementations herein.

FIG. 3 illustrates an example of a method 300 for forming a semiconductor material on a wafer, as described in some implementations herein.

At block 310, the method 300 includes heating a wafer to a deposition temperature in a range between 550° C. and 900° C. within a processing system.

At block 320, the method 300 includes exposing the wafer to a deposition gas comprising a gallium precursor gas, an aluminum precursor gas, and arsine at a total pressure in a range between 20 Torr and 1,000 Torr.

At block 330, the method 300 includes depositing one or more layers on the wafer at a deposition rate selected from the group consisting of 30 μm/hr, 40 μm/hr, 50 μm/hr, 55 μm/hr, 60 μm/hr, 70 μm/hr, 80 μm/hr, and 90-120 μm/hr deposition rates, where the one or more layers include aluminum gallium arsenide, and multiple layers, including the one or more layers, form a gallium arsenide cell.

In an aspect of the method 300, for the 90-120 μm/hr deposition rates the range of the deposition temperature is between 680° C. and 850° C.

In another aspect of the method 300, an n-type portion of the gallium arsenide cell is deposited over a sacrificial layer having a thickness between 1 nm and 20 nm, where the sacrificial layer is disposed over a buffer layer, and where the buffer layer is disposed over the wafer.

In another aspect of the method 300, the multiple layers form an n-type gallium arsenide stack and a p-type gallium arsenide stack, where the n-type gallium arsenide stack has an emitter layer disposed on or over a first passivation layer, and where the first passivation layer is disposed on or over a first contact layer; and where the p-type gallium arsenide stack has a second contact layer disposed on or over a second passivation layer, and where the second passivation layer is disposed on or over an absorber layer.

In another aspect of the method 300, the range of the deposition temperature can be between 600° C. and 800° C.

In another aspect of the method 300, the range of the total pressure can be selected from the group consisting of between 20 Torr and 760 Torr, between 50 Torr and 450 Torr, and between 100 Torr and 250 Torr.

Figure 4:
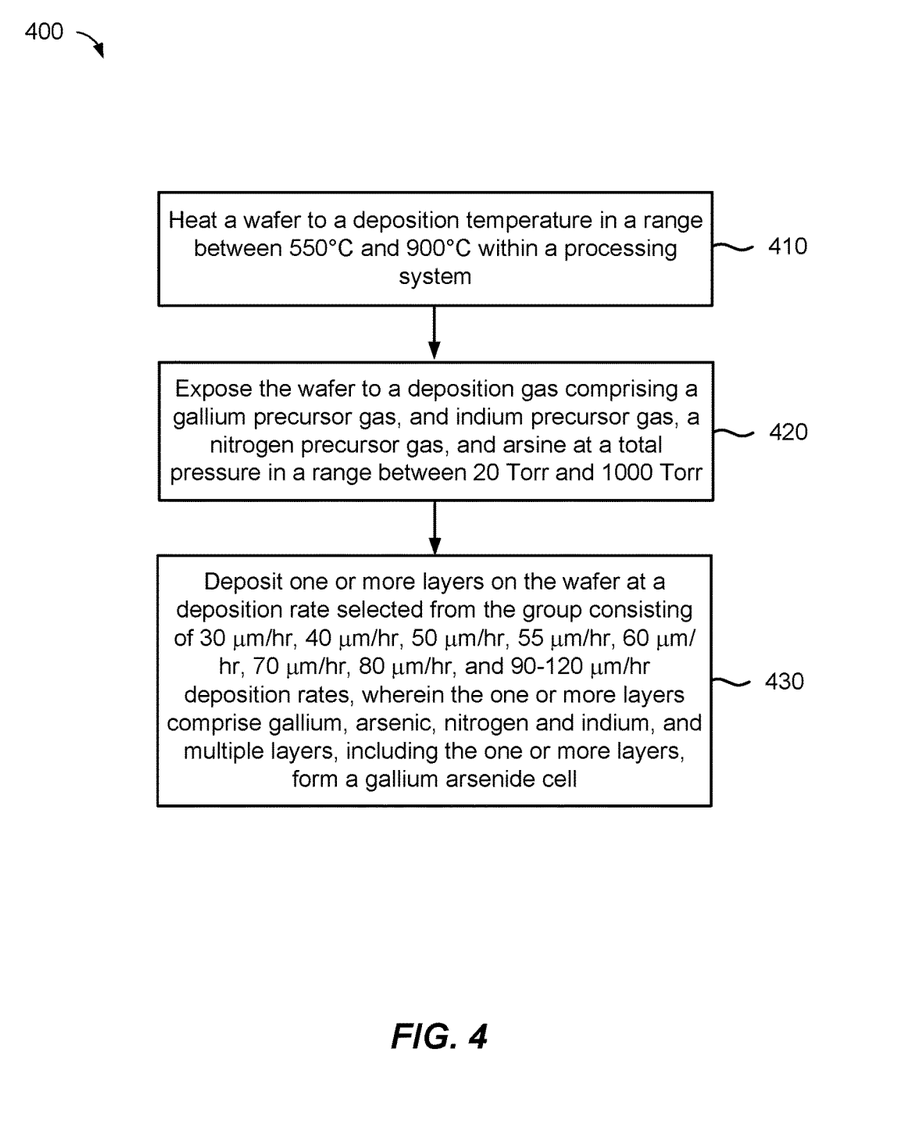
FIG. 4 illustrates an example of yet another method for forming a semiconductor material on a wafer, as described in some implementations herein.

FIG. 4 illustrates an example of a method 400 for forming a semiconductor material on a wafer, as described in some implementations herein.

At block 410, the method 400 includes heating a wafer to a deposition temperature in a range between 550° C. and 900° C. within a processing system.

At block 420, the method 400 includes exposing the wafer to a deposition gas comprising a gallium precursor gas, an indium precursor gas, a nitrogen precursor gas and arsine at a total pressure in a range between 20 Torr and 1000 Torr.

At block 430, the method 400 includes depositing one or more layers on the wafer at a deposition rate selected from the group consisting of 30 μm/hr, 40 μm/hr, 50 μm/hr, 55 μm/hr, 60 μm/hr, 70 μm/hr, 80 μm/hr, and 90-120 μm/hr deposition rates, where the one or more layers comprise gallium, arsenic, nitrogen and indium, and multiple layers, including the one or more layers, form a gallium arsenide cell.

In an aspect of the method 400, for the 90-120 μm/hr deposition rates the range of the deposition temperature is between 680° C. and 850° C.

In another aspect of the method 400, the nitrogen precursor gas comprises a compound selected from the group consisting of hydrazine, methylhydrazine, dimethylhydrazine, derivatives thereof, and combinations thereof.

In another aspect of the method 400, an n-type portion of the gallium arsenide cell is deposited over a sacrificial layer having a thickness between 1 nm and 20 nm, where the sacrificial layer is disposed over a buffer layer, and where the buffer layer is disposed over the wafer.

In another aspect of the method 400, the multiple layers form an n-type gallium arsenide stack and a p-type gallium arsenide stack, where the n-type gallium arsenide stack has an emitter layer disposed on or over a first passivation layer, and where the first passivation layer is disposed on or over a first contact layer; and where the p-type gallium arsenide stack has a second contact layer disposed on or over a second passivation layer, and where the second passivation layer is disposed on or over an absorber layer.

In another aspect of the method 400, the deposition temperature can be between 400° C. and 500° C.

In another aspect of the method 400, the range of the total pressure can be selected from the group consisting of between 20 Torr and 760 Torr, between 50 Torr and 450 Torr, and between 100 Torr and 250 Torr.

Figure 5:
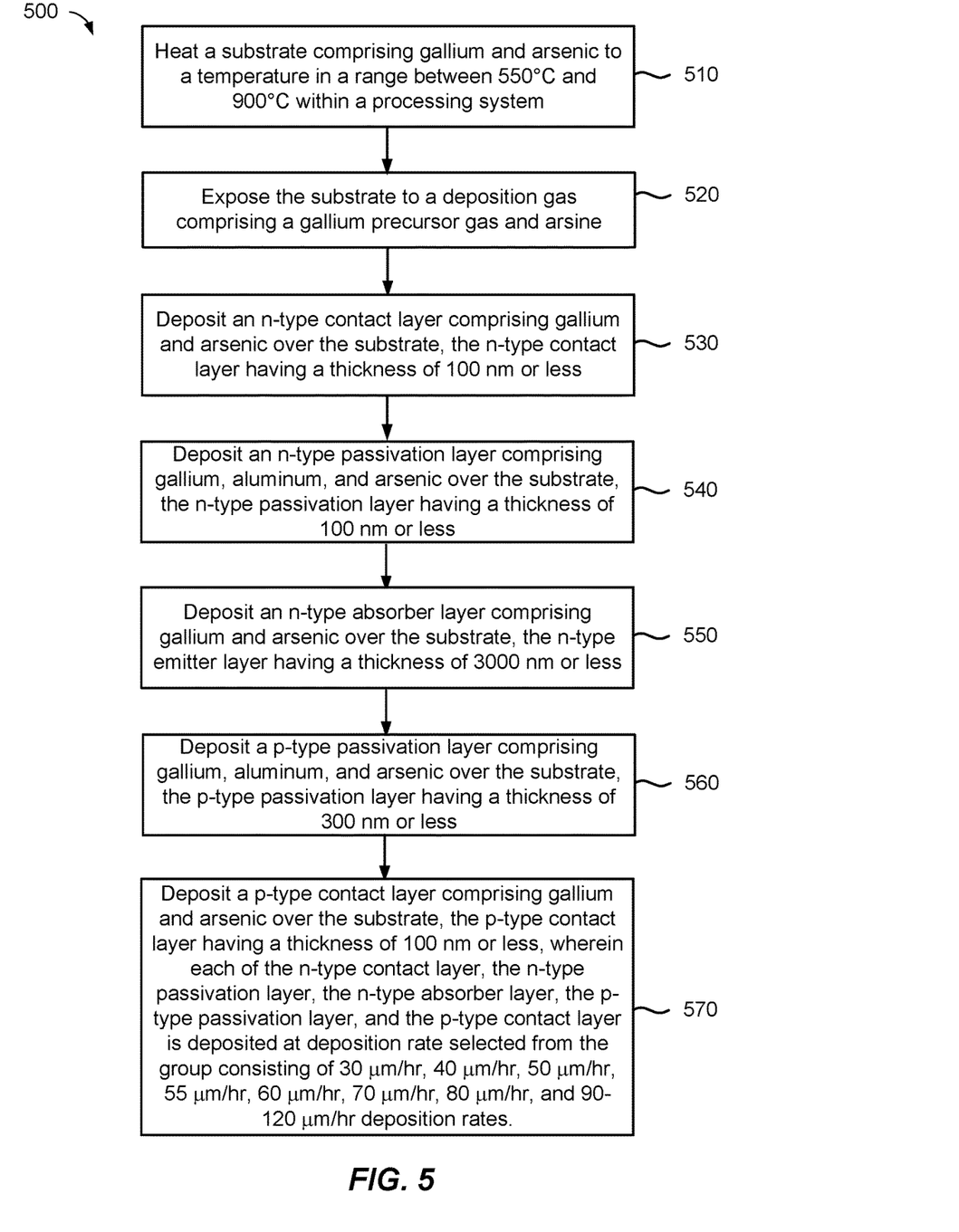
FIG. 5 illustrates an example of a method for forming a cell, as described in some implementations herein.

FIG. 5 illustrates an example of a method 500 for forming a cell, as described in some implementations herein.

At block 510, the method 500 includes heating a substrate comprising gallium and arsenic to a temperature in a range between 550° C. and 900° C. within a processing system.

At block 520, the method 500 includes exposing the substrate to a deposition gas comprising a gallium arsenide precursor gas and arsine.

At block 530, the method 500 includes depositing an n-type contact layer comprising gallium and arsenic over the substrate, where the n-type contact layer has a thickness of 100 nm or less.

At block 540, the method 500 includes depositing an n-type passivation layer comprising gallium, aluminum, and arsenic over the substrate, where the n-type passivation layer has a thickness of 100 nm or less.

At block 550, the method 500 includes depositing an n-type absorber layer comprising gallium and arsenic over the substrate, where the n-type emitter layer has a thickness of 3000 nm or less.

At block 560, the method 500 includes depositing a p-type passivation layer comprising gallium, aluminum, and arsenic over the substrate, where the p-type passivation layer has a thickness of 300 nm or less.

At block 570, the method 500 includes depositing a p-type contact layer comprising gallium and arsenic over the substrate, the p-type contact layer having a thickness of 100 nm or less, where each of the n-type contact layer, the n-type passivation layer, the n-type absorber layer, the p-type passivation layer, and the p-type contact layer is deposited at deposition rate selected from the group consisting of 30 μm/hr, 40 μm/hr, 50 μm/hr, 55 μm/hr, 60 μm/hr, 70 μm/hr, 80 μm/hr, and 90-120 μm/hr deposition rates.

In another aspect of the method 500, for the 90-120 μm/hr deposition rates the range of the deposition temperature is between 680° C. and 850° C.

In another aspect of the method 500, the method further includes depositing a sacrificial layer comprising aluminum and arsenic over the substrate at a deposition rate selected from the group consisting of 30 μm/hr, 40 μm/hr, 50 μm/hr, 55 μm/hr, 60 μm/hr, 70 μm/hr, 80 μm/hr, and 90-120 μm/hr deposition rates, where the sacrificial layer has a thickness of 20 nm or less. The method can further include depositing the n-type contact layer over the sacrificial layer, depositing the n-type passivation layer over the n-type contact layer, depositing the n-type absorber layer over the n-type passivation layer, depositing the p-type passivation layer over the p-type absorber layer, and depositing the p-type contact layer over the p-type passivation layer.

In another aspect of the method 500, the method further includes depositing a buffer layer comprising gallium and arsenic on the substrate at a deposition rate selected from the group consisting of a 30 μm/hr deposition rate, a 40 μm/hr deposition rate, a 50 μm/hr deposition rate, a 55 μm/hr deposition rate, and a 60 μm/hr deposition rate or greater, where the buffer layer has a thickness of less than 300 nm. The can further include depositing the sacrificial layer over the buffer layer.

In another aspect of the method 500, the method further includes depositing a sacrificial layer comprising aluminum and arsenic over the substrate at a deposition rate selected from the group consisting of 30 μm/hr, 40 μm/hr, 50 μm/hr, 55 μm/hr, 60 μm/hr, 70 μm/hr, 80 μm/hr, and 90-120 μm/hr deposition rates, where the sacrificial layer has a thickness of 20 nm or less, In another aspect of the method 500, the method further includes depositing a buffer layer comprising gallium and arsenic on the substrate at a deposition rate selected from the group consisting of 30 μm/hr, 40 μm/hr, 50 μm/hr, 55 μm/hr, 60 μm/hr, 70 μm/hr, 80 μm/hr, and 90-120 μm/hr deposition rates, where the buffer layer has a thickness of less than 300 nm. The method can further include depositing the sacrificial layer over the buffer layer.

In another aspect of the method 500, exposing the substrate to the deposition gas further includes exposing the substrate to a total pressure of 450 Torr or less, or exposing the substrate to a total pressure of at least 780 Torr.

While the foregoing is directed to implementations of the disclosure, other and further implementations of the disclosure may be devised without departing from the basic scope thereof, and the scope thereof is determined by the claims that follow.

What is claimed is:

1. A method for forming a semiconductor material on a wafer, comprising:
heating the wafer to a deposition temperature in a range between 680° C. and 850° C. within a processing system, wherein the wafer is a support substrate comprising one or more Group III/V compound semiconductor materials;
exposing the wafer to a deposition gas comprising a gallium precursor gas and arsine at a total pressure in a range between 20 Torr and 1000 Torr, wherein the deposition gas includes an arsine/gallium precursor ratio of 3 or greater; and
depositing one or more layers having gallium arsenide on the wafer at a deposition rate of 90-120 μm/hr,
wherein multiple layers, including the one or more layers, form a gallium arsenide cell, wherein the gallium arsenide cell forms an n-type stack and a p-type stack deposited over then-type stack, wherein then-type stack is deposited over a sacrificial layer having a thickness between 1 nm and 20 nm, the sacrificial layer being disposed over a buffer layer, and the buffer layer being disposed over the wafer, wherein then-type stack comprises an emitter layer disposed on or over a first passivation layer, the first passivation layer being disposed on or over a first contact layer, the first contact layer being disposed on or over the sacrificial layer, wherein the p-type stack comprises a second contact layer disposed on or over a second passivation layer, the second passivation layer being disposed on or over an absorber layer, and the absorber layer being disposed on or over the emitter layer, wherein the emitter layer and the absorber layer contain gallium arsenide and are formed using a first mixture of arsine in hydrogen gas and a second mixture of trimethylgallium in hydrogen gas, and wherein a the first mixture is 10 cc of arsine in 2,000 cc of hydrogen gas and 200 cc of the second mixture of 10% trimethylgallium in hydrogen gas.

2. The method of claim 1, wherein the deposition gas further comprises an aluminum precursor gas and the one or more layers having gallium arsenide further comprises aluminum.

3. The method of claim 2, wherein the aluminum precursor gas comprises an alkyl aluminum compound.

4. The method of claim 3, wherein the alkyl aluminum compound is trimethylaluminum or triethylaluminum.

5. The method of claim 1, wherein the deposition gas further comprises a carrier gas comprising a mixture of hydrogen and argon.

6. The method of claim 1, wherein the range of the total pressure is selected from a group consisting of:
between 20 Torr and 760 Torr,
between 50 Torr and 450 Torr, and
between 100 Torr and 250 Torr.

7. A method for forming a semiconductor material on a wafer, comprising:
heating the wafer to a deposition temperature in a range between 680° C. and 850° C. within a processing system, wherein the wafer is a support substrate comprising one or more Group III/V compound semiconductor materials;
exposing the wafer to a deposition gas comprising a gallium precursor gas, an aluminum precursor gas, and arsine at a total pressure in a range between 20 Torr and 1000 Torr, wherein the deposition gas includes an arsine/gallium precursor ratio of 3 or greater; and depositing one or more layers on the wafer at a deposition rate of 90-120 μm/hr, wherein the one or more layers include aluminum gallium arsenide, and multiple layers, including the one or more layers, form an aluminum gallium arsenide cell, wherein the aluminum gallium arsenide cell forms an n-type stack and a p-type stack deposited over the n-type stack, wherein then-type stack is deposited over a sacrificial layer having a thickness between 1 nm and 20 nm, the sacrificial layer being disposed over a buffer layer, and the buffer layer being disposed over the wafer, wherein the n-type stack comprises an emitter layer disposed on or over a first passivation layer, the first passivation layer being disposed on or over a first contact layer, the first contact layer being disposed on or over the sacrificial layer, wherein the p-type stack comprises a second contact layer disposed on or over a second passivation layer, the second passivation layer being disposed on or over an absorber layer, and the absorber layer being disposed on or over the emitter layer, wherein the emitter layer and the absorber layer contain aluminum gallium arsenide and are formed using a first mixture of arsine in hydrogen gas and a second mixture of trimethylgallium in hydrogen gas, and wherein the first mixture is 10 cc of arsine in 2,000 cc of hydrogen gas and 200 cc of the second mixture of 10% trimethylgallium in hydrogen gas.

8. The method of claim 7, wherein the range of the total pressure is selected from a group consisting of:
   between 20 Torr and 760 Torr,
   between 50 Torr and 450 Torr, and
   between 100 Torr and 250 Torr.

9. A method for forming a semiconductor material on a wafer, comprising:
   heating the wafer to a deposition temperature in a range between 680° C. and 850° C. within a processing system, wherein the wafer is a support substrate comprising one or more Group III/V compound semiconductor materials;
   exposing the wafer to a deposition gas comprising a gallium precursor gas, an indium precursor gas, a nitrogen precursor gas and arsine at a total pressure in a range between 20 Torr and 1000 Torr, wherein the deposition gas includes an arsine/gallium precursor ratio of 3 or greater; and
   depositing one or more layers on the wafer at a deposition rate 90-120 μm/hr,
   wherein the one or more layers comprise gallium, arsemc, nitrogen and indium, and multiple layers, including the one or more layers, form a gallium indium arsenide nitride cell, wherein the gallium indium arsenide nitride cell forms an n-type stack and a p-type stack deposited over the n-type stack, wherein the n-type stack is deposited over a sacrificial layer having a thickness between 1 nm and 20 nm, the sacrificial layer being disposed over a buffer layer, and the buffer layer being disposed over the wafer, wherein then-type stack comprises an emitter layer disposed on or over a first passivation layer, the first passivation layer being disposed on or over a first contact layer, the first contact layer being disposed on or over the sacrificial layer, wherein the p-type stack comprises a second contact layer disposed on or over a second passivation layer, the second passivation layer being disposed on or over an absorber layer, and the absorber layer being disposed on or over the emitter layer, wherein the emitter layer and the absorber layer contain gallium indium arsenide nitride and are formed using a first mixture of arsine in hydrogen gas and a second mixture of trimethylgallium in hydrogen gas, and wherein the first mixture is 10 cc of arsine in 2,000 cc of hydrogen gas and 200 cc of the second mixture of 10% trimethylgallium in hydrogen gas.

10. The method of claim 9, wherein the nitrogen precursor gas comprises a compound selected from group consisting of hydrazine, methylhydrazine, dimethylhydrazine, derivatives thereof, and combinations thereof.

11. The method of claim 9, wherein the range of the total pressure is selected from group consisting of:
    between 20 Torr and 760 Torr,
    between 50 Torr and 450 Torr, and
    between 100 Torr and 250 Torr.

12. A method of forming a cell, comprising:
    heating a substrate comprising gallium and arsenic to a temperature in a range between 680° C. and 850° C. within a processing system, wherein the substrate comprises one or more Group III/V compound semiconductor materials;
    exposing the substrate to a deposition gas comprising at least a gallium precursor gas and arsine, wherein the deposition gas includes an arsine/gallium precursor ratio of 3 or greater;
    depositing an n-type contact layer comprising gallium and arsenic over the substrate, the n-type contact layer having a thickness of 100 nm or less;
    depositing an n-type passivation layer comprising gallium, aluminum, and arsenic over the n-type contact layer, the n-type passivation layer having a thickness of 100 nm or less;
    depositing an n-type emitter layer comprising gallium and arsenic over the n-type passivation layer, then-type emitter layer having a thickness of 3000 nm or less;
    depositing a p-type absorber layer comprising gallium and arsenic over then-type emitter layer, the p-type absorber layer having a thickness of 3000 nm or less;
    depositing a p-type passivation layer comprising gallium, aluminum, and arsenic over the p-type absorber layer, the p-type passivation layer having a thickness of 300 nm or less; and
    depositing a p-type contact layer comprising gallium and arsenic over the p-type passivation layer, the p-type contact layer having a thickness of 100 nm or less,
    wherein each of the n-type contact layer, the n-type passivation layer, the n-type emitter layer, the p-type absorber layer, the p-type passivation layer, and the p-type contact layer is deposited at deposition rate 90-120 μm/hr, and
    wherein the n-type emitter layer and the p-type absorber layer contain gallium and are formed using a first mixture of arsine in hydrogen gas and a second mixture of trimethylgallium in hydrogen gas, wherein the first mixture is 10 cc of arsine in 2,000 cc of hydrogen gas and 200 cc of the second mixture of 10% trimethylgallium in hydrogen gas.

13. The method of claim 12, further comprising:
    depositing a sacrificial layer comprising aluminum and arsenic over the substrate at a deposition rate selected from group consisting of 30 μm/hr, 40 μm/hr, 50 μm/hr, 55 μm/hr, 60 μm/hr, 70 μm/hr, 80 μm/hr, and 90-120 μm/hr deposition rates, the sacrificial layer having a thickness of 20 nm or less; and depositing then-type contact layer over the sacrificial layer.

14. The method of claim 13, further comprising:
depositing a buffer layer comprising gallium and arsenic on the substrate at a deposition rate selected from group consisting of a 30 μm/hr deposition rate, a 40 μm/hr deposition rate, a 50 μm/hr deposition rate, a 55 μm/hr deposition rate, a 60 μm/hr deposition rate, a 70 μm/hr deposition rate, an 80 μm/hr deposition rate, and a 90-120 μm/hr deposition rate, the buffer layer having a thickness of less than 300 nm; and
depositing the sacrificial layer over the buffer layer.

15. The method of claim 13, further comprising:
depositing a buffer layer comprising gallium and arsenic on the substrate at a deposition rate selected from gj, group consisting of 30 μm/hr, 40 μm/hr, 50 μm/hr, 55 μm/hr, 60 μm/hr, 70 μm/hr, 80 μm/hr, and 90-120 μm/hr deposition rates, the buffer layer having a thickness of less than 300 nm; and
depositing the sacrificial layer over the buffer layer.

16. The method of claim 12, wherein exposing the substrate to a deposition gas further comprises:
exposing the substrate to a total pressure of 450 Torr or less, or
exposing the substrate to a total pressure of at least 780 Torr.

17. The method of claim 1, wherein the method is performed in a metal-organic chemical vapor deposition (MOCVD) tool.

18. The method of claim 7, wherein the method is performed in a metal-organic chemical vapor deposition (MOCVD) tool.

19. The method of claim 9, wherein the method is performed in a metal-organic chemical vapor deposition (MOCVD) tool.

20. The method of claim 12, wherein the method is performed in a metal-organic chemical vapor deposition (MOCVD) tool.

* * * * *